(12) United States Patent
Yamazaki et al.

(10) Patent No.: US 8,093,076 B2
(45) Date of Patent: Jan. 10, 2012

(54) ORGANIC LIGHT EMITTING APPARATUS AND METHOD OF PRODUCING THE SAME

(75) Inventors: Takuro Yamazaki, Kawasaki (JP); Kohei Nagayama, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/623,182

(22) Filed: Nov. 20, 2009

(65) Prior Publication Data

US 2010/0068840 A1 Mar. 18, 2010

Related U.S. Application Data

(62) Division of application No. 11/676,187, filed on Feb. 16, 2007, now Pat. No. 7,646,037.

(30) Foreign Application Priority Data

Mar. 28, 2006 (JP) .................................. 2006-087310
Feb. 6, 2007 (JP) .................................. 2007-026707

(51) Int. Cl.
 *H01L 21/00* (2006.01)
(52) U.S. Cl. ................. 438/22; 438/26; 438/33; 438/99; 257/E25.032
(58) Field of Classification Search .................... 438/26, 438/22, 33, 99, 462, 465; 257/E25.032
See application file for complete search history.

(56) References Cited

U.S. PATENT DOCUMENTS

| | | | |
|---|---|---|---|
| 4,410,580 A | 10/1983 | Okutsu | 428/156 |
| 6,297,869 B1 | 10/2001 | Choo et al. | 349/187 |
| 7,038,836 B2 | 5/2006 | Yamazaki et al. | 359/321 |
| 2002/0180371 A1* | 12/2002 | Yamazaki et al. | 315/169.3 |
| 2002/0187575 A1 | 12/2002 | Maruyama et al. | 438/33 |
| 2004/0137142 A1* | 7/2004 | Nishikawa | 427/66 |
| 2005/0200273 A1* | 9/2005 | Nozawa | 313/503 |
| 2005/0285522 A1 | 12/2005 | Han et al. | 313/512 |
| 2007/0222382 A1 | 9/2007 | Yamazaki et al. | 313/512 |
| 2008/0042559 A1 | 2/2008 | Yamazaki | 313/504 |

FOREIGN PATENT DOCUMENTS

| | | |
|---|---|---|
| JP | 6-048755 | 2/1994 |
| JP | 2001-056455 A | 2/2001 |
| JP | 2002-329576 | 11/2002 |
| JP | 2002-352951 | 12/2002 |
| JP | 2003-015099 | 1/2003 |
| JP | 2003-181825 | 7/2003 |
| JP | 2006-004909 A | 1/2006 |

OTHER PUBLICATIONS

English translation of JP 2002-352951A.
Japanese Office Action issued in the counterpart application No. 2001-026707 dated Feb. 8, 2011 along with its English-language translation—9 pages.

* cited by examiner

*Primary Examiner* — Michael Trinh
(74) *Attorney, Agent, or Firm* — Fitzpatrick, Cella, Harper & Scinto

(57) ABSTRACT

Provided are an organic light emitting apparatus for use in, for example, a flat device display, and a method of producing the apparatus. The organic light emitting apparatus has sides formed by division at ends of its substrate. Three-dimensional portions are formed on the surface of the substrate along the sides. An inorganic sealing layer is formed to extend toward the three-dimensional portions.

8 Claims, 8 Drawing Sheets

ORGANIC LIGHT EMITTING APPARATUS AND METHOD OF PRODUCING THE SAME

CROSS-REFERENCE TO RELATED APPLICATIONS

This application is a divisional application of U.S. Application No. 11/676,187 filed Feb. 16, 2007, which claims priority of Japanese Patent Application Nos. 2006-087310, filed Mar. 28, 2006 and 2007-026707, filed Feb. 6, 2007. The contents of all of the aforementioned applications are hereby incorporated by reference herein in their entireties.

BACKGROUND OF THE INVENTION

1. Field of the Invention

The present invention relates to an organic light emitting apparatus for use in, for example, a flat device display, and a method of producing the apparatus.

2. Description of the Related Art

An organic light emitting apparatus having an organic electroluminescence (EL) device as a self light emitting device has been recently attracting attention because of its potential to serve as a flat device display. The organic EL device is obtained by laminating at least a first electrode, a stack layer including an organic light emitting layer, and a second electrode in the stated order on a substrate. The organic EL device is liable to cause the deterioration of its properties owing to moisture or oxygen; a trace amount of moisture peels the stack layer off of an electrode layer, and the peeling is responsible for the occurrence of a dark spot. In view of the foregoing, the organic EL device is covered with an etching glass cover, a sealing agent is stuck to the periphery of the resultant, and the inside of the resultant is mounted with a moisture absorbent so that moisture infiltrating from a sealing surface is absorbed by the moisture absorbent. As a result, the lifetime of the organic EL device is secured.

The realization of a thin, space-saving flat device display using the organic EL device requires a reduction in space of the moisture absorbent around a light emitting area. An example of a method of sealing the organic EL device while eliminating the need for the moisture absorbent is a method involving laminating a sealing layer on the second electrode. A high-performance sealing layer for preventing moisture or oxygen from infiltrating into the stack layer is requested.

A silicon oxynitride film obtained by a CVD method or a sputtering method, or a sealing layer obtained by laminating ceramic and an organic film has been specifically proposed as a sealing layer for an organic EL device. Moisture or oxygen can be shielded by using any one of those sealing layers each formed of an inorganic material for an organic light emitting layer.

By the way, in the production of an organic light emitting apparatus having such organic EL device, from the viewpoint of a reduction in production cost, plural organic light emitting apparatuses are produced on a large substrate, and then division (separation) is performed.

Each of the following proposals has been made as a method of dividing individual organic light emitting apparatuses from a large substrate on which plural organic light emitting apparatuses are formed.

Japanese Patent No. 3,042,192 describes the following invention: scribing and breaking are sequentially performed from both surfaces of a bonded substrate in the division of the substrate so that damage to the substrate in a dividing step is reduced.

Japanese Patent Application Laid-Open No. 2003-181825 describes the following invention: upon production of organic light emitting apparatuses by plural patterning, a pressure transmitting portion for transmitting a pressure in a breaking step from one substrate to the other substrate is formed, whereby a problem of defective sectioning of the substrate can be solved.

However, when individual organic light emitting apparatuses are divided by employing a general scribing approach from a substrate on which plural organic light emitting apparatuses are formed, the peeling or cracking of a sealing layer occurs at a position where the apparatus is to be divided. As a result, moisture or a gas component infiltrates into a stack layer, thereby leading to the deterioration of display. None of Japanese Patent No. 3,042,192 and Japanese Patent Application Laid-Open No. 2003-181825 describes measures for a reduction in occurrence of the peeling and cracking of a sealing layer formed of an inorganic material at a position where the apparatus is to be divided.

The present invention has been made in view of the above-mentioned problems, and an object of the present invention is to provide an organic light emitting apparatus that can be divided without receiving damage to a sealing layer such as peeling or cracking in a step of dividing individual organic light emitting apparatuses from a substrate on which plural organic light emitting apparatuses are formed, and a method of producing the apparatus.

SUMMARY OF THE INVENTION

According to one aspect of the present invention, there is provided the following organic light emitting apparatus as means for solving the above-mentioned problems of the prior art.

That is, an organic light emitting apparatus obtained by dividing plural organic light emitting apparatuses that are integrally formed includes: a substrate having at least a base material, the substrate having sides formed by dividing the substrate at its ends, and the substrate having three-dimensional portions formed on its surface along the sides; an organic light emitting device formed on the substrate, the organic light emitting device having a first electrode, an organic light emitting layer, and a second electrode in the stated order on the substrate; and an inorganic sealing layer formed to cover an upper portion of the organic light emitting device and the surface of the substrate and to extend toward the three-dimensional portions.

According to another aspect of the present invention, there is provided the following method of producing an organic light emitting apparatus.

That is, there is provided a method of producing an organic light emitting apparatus, the organic light emitting apparatus having a substrate, an organic light emitting device having a first electrode, an organic light emitting layer, and a second electrode formed in the stated order on the substrate, and an inorganic sealing layer formed to cover an upper portion of the organic light emitting device and a surface of the substrate and to extend toward an end of the substrate, the method including the steps of: forming the organic light emitting device having the first electrode, the organic light emitting layer, and the second electrode in the stated order on the substrate; forming a three-dimensional portion along a division line set in advance on the surface of the substrate; forming the inorganic sealing layer in the division line from above the second electrode so that the inorganic sealing layer straddles the three-dimensional portion; and dividing the substrate and inorganic sealing layer along the division line.

According to the present invention, individual organic light emitting apparatuses can be divided without causing damage to a sealing layer such as peeling or cracking in a step of dividing individual organic light emitting apparatuses from a substrate on which plural organic light emitting apparatuses are formed. As a result, it can prevent moisture or a gas component from infiltrating into a stack layer completely, whereby an organic light emitting apparatus having a long lifetime in which the deterioration of light emission is suppressed can be obtained.

Further features of the present invention will become apparent from the following description of exemplary embodiments with reference to the attached drawings.

DESCRIPTION OF THE EMBODIMENTS

Hereinafter, an embodiment of the present invention will be described with reference to the drawings. It should be noted that each of those drawings schematically illustrates an example of the constitution of an organic light emitting apparatus according to the present invention by taking part of the constitution.

Figure 1A:
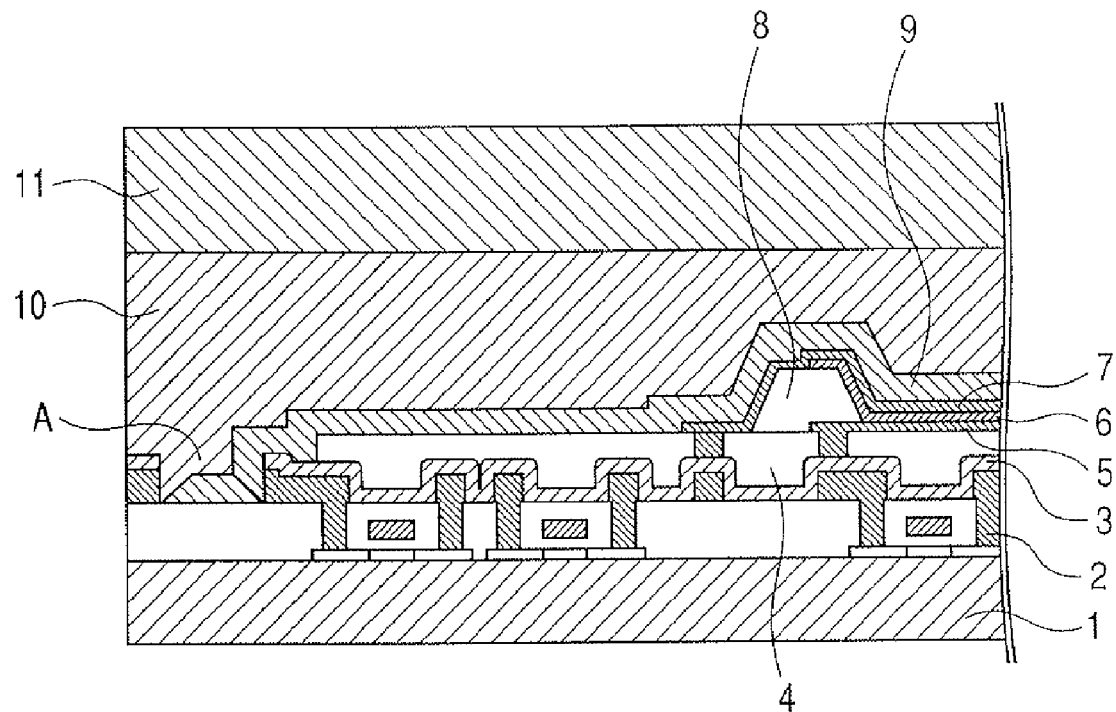
FIGS. 1A and 1B are sectional views each schematically illustrating an example of an embodiment of an organic light emitting apparatus of the present invention.
Figure 1B:
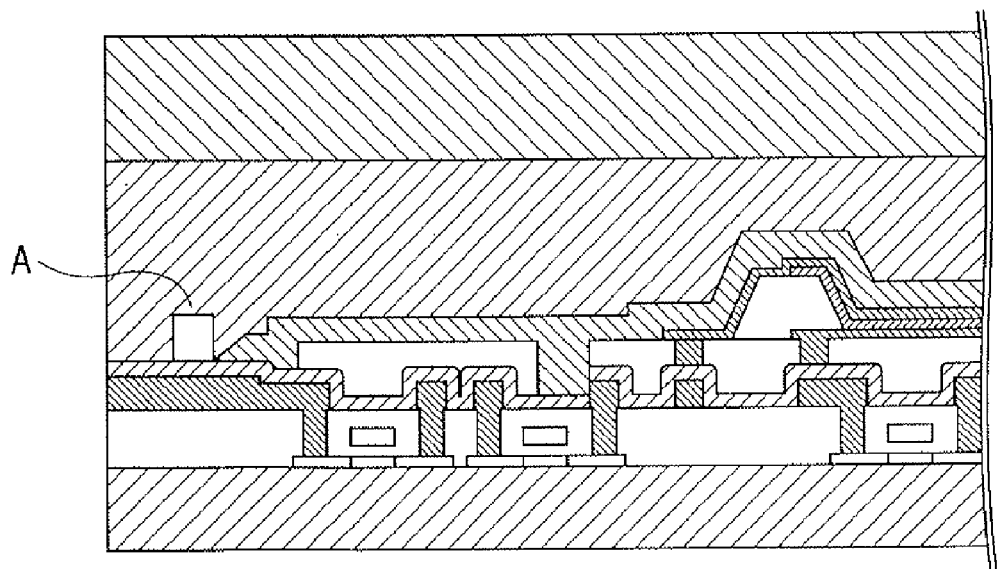

FIGS. 1A and 1B are schematic sectional views each illustrating part of an organic light emitting apparatus for illustrating an example of a device constitution. The figures each illustrate a range from an end of a display region to the peripheral region of the region. The light emitting apparatus illustrated in each of FIGS. 1A and 1B has sides formed by the division of a substrate at its ends.

A layer (source/drain electrode layer) 2 for constituting a thin film transistor (hereinafter referred to as "TFT"), an insulating layer 3, and an organic leveling layer 4 are laminated and formed in the stated order on a glass base material 1. In this embodiment, the above constitution is adopted as a substrate. Then, a first electrode 5 of a unit pixel is formed on the upper portion of the substrate, and the periphery of each pixel is covered with a device isolation film 8 made of polyimide. A stack layer (organic compound layer) 6 is formed by sequentially laminating a hole transporting layer, an organic light emitting layer, an electron transporting layer, and an electron injecting layer on the glass base material 1. A second electrode 7 is formed on the upper portion of the structure. Then, the first electrode 5, the stack layer 6 including the organic light emitting layer, and the second electrode 7 form an organic EL device. Further, a sealing layer 9 formed of an inorganic material for completely covering the second electrode 7, the stack layer 6, the device isolation film 8, and the organic leveling layer 4 except an extraction electrode is formed. Then, a circular polarizer 11 is provided for the upper portion of the resultant including the sealing layer 9 through an adhesive 10.

In this embodiment, the substrate has only to have at least the base material 1. This is because the present invention is applicable to not only an active matrix type light emitting apparatus having a thin film transistor for driving an individual organic EL device as described above but also a passive matrix type light emitting apparatus in which light emission is obtained at a portion of intersection of stripe-shaped electrodes. In the latter apparatus, the substrate has no thin film transistor, and an electrode is formed on the base material 1 in some cases.

In addition, in this embodiment, the layer 2 for constituting a TFT is a layer identical to a source/drain electrode. The layer 2 may be a layer different from a source/drain electrode. For example, the layer 2 may be a layer identical to a gate electrode layer.

In addition, the stack layer 6 has only to have at least an organic light emitting layer; the structure desirably has a hole transporting layer, an electron transporting layer, and an electron injecting layer as described above.

In the constitution illustrated in FIG. 1A, a three-dimensional portion A having a concave structure is formed in the layer 2 for constituting a TFT and the insulating layer 3 for covering the TFT along a side formed by the division of the substrate, and the end of the sealing layer 9 to be formed is determined by the three-dimensional portion A. In the constitution illustrated in FIG. 1B, a three-dimensional portion A having a convex structure is formed on the insulating layer 3, and the end of the sealing layer 9 to be formed is determined by the three-dimensional portion A. It should be noted that the three-dimensional portion A formed to have a predetermined depth in the direction toward the base material 1 from the surface on which the insulating layer 3 is formed has a concave structure, while the three-dimensional portion A formed to have a predetermined height in the direction opposite to the base material 1 from the surface on which the insulating layer 3 is formed has a convex structure.

Figure 2:
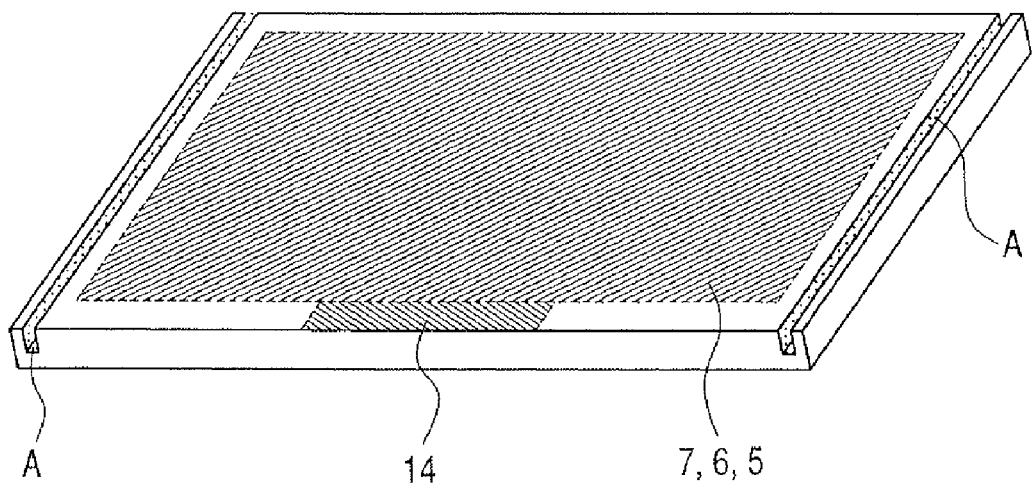
FIG. 2 is a perspective view illustrating an example of the shape and placement position of a three-dimensional portion of the organic light emitting apparatus of the present invention.
Figure 3:
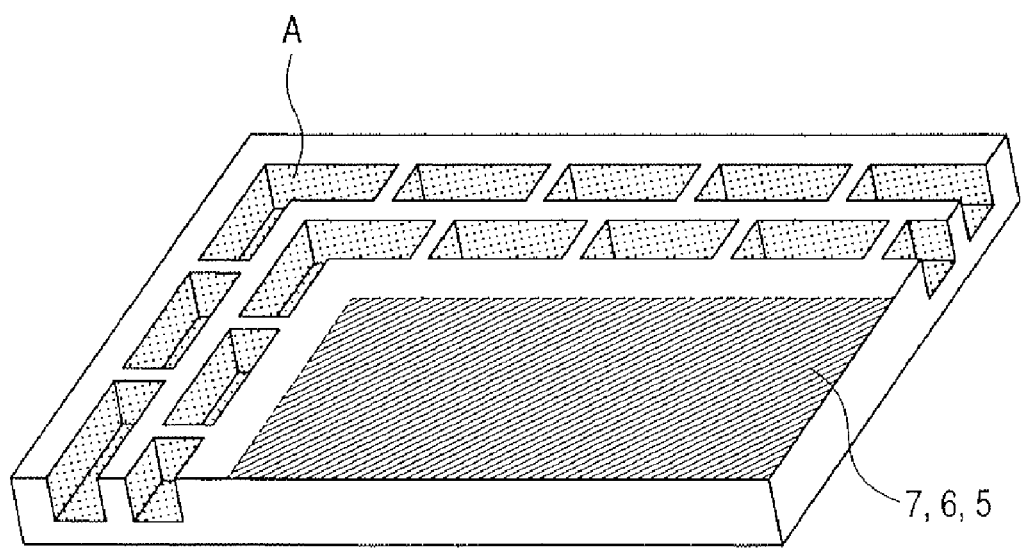
FIG. 3 is a perspective view illustrating another example of the shape and placement position of the three-dimensional portion of the organic light emitting apparatus of the present invention.
Figure 4A:
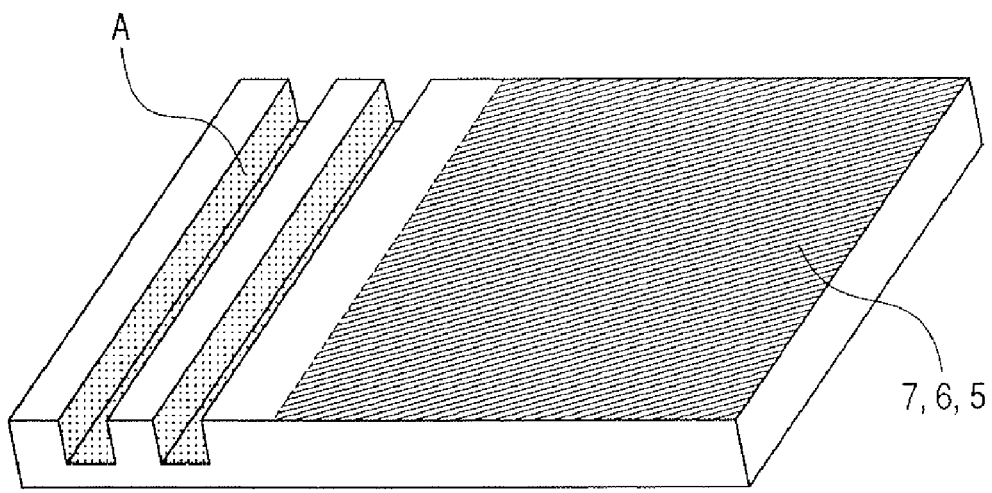
FIGS. 4A and 4B are perspective views each illustrating another example of the shape and placement position of the three-dimensional portion of the organic light emitting apparatus of the present invention.
Figure 4B:
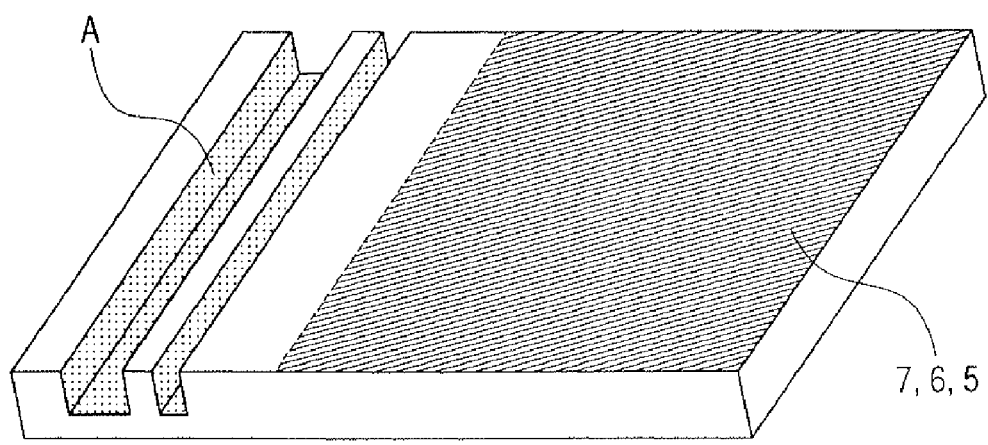

The three-dimensional portion A of the present invention is formed on the periphery of a display region in order that the crack or film quality discontinuous region of the sealing layer 9 may be generated at the position where the three-dimensional portion A is formed. The three-dimensional portion A is formed so as to be parallel to at least one side of the display region. Specifically, as illustrated in FIG. 2, the three-dimensional portions A are formed on two sides except the side on which a power source and a signal supply pad 14 are formed and a side opposed to the side. Alternatively, as illustrated in FIG. 3, the three-dimensional portions A are formed on two adjacent sides. In addition, as illustrated in each of FIGS. 4A and 4B, the plural trains of, or plural, three-dimensional portions A are formed on the periphery of a display region so as to be parallel to one side of the display region. Of course, the three-dimensional portions A may be formed on all four sides so as to surround the display region. In this case, each three-dimensional portion A is desirably formed into a line shape with a predetermined pitch between the portion and the display region. However, how to place the portions is not particularly limited as long as a crack or a film quality discontinuous region can be generated in the sealing layer 9 upon division of an organic light emitting apparatus. For example, as illustrated in FIG. 3, an organizational structure formed of the three-dimensional portions A each of which is shorter than a certain side of the display region may be formed. When a resin layer is formed on the periphery of the display region, each three-dimensional portion A is formed in the outer peripheral region of the resin layer.

Figure 5A:
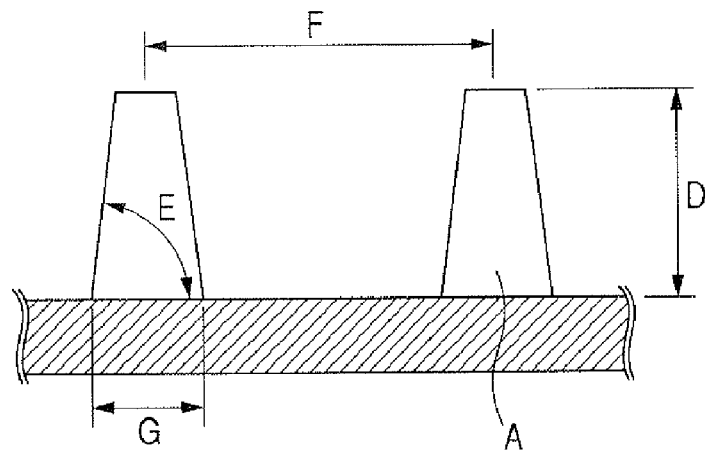
FIGS. 5A and 5B are sectional views each schematically illustrating the shape of the three-dimensional portion of the organic light emitting apparatus of the present invention.
Figure 5B:
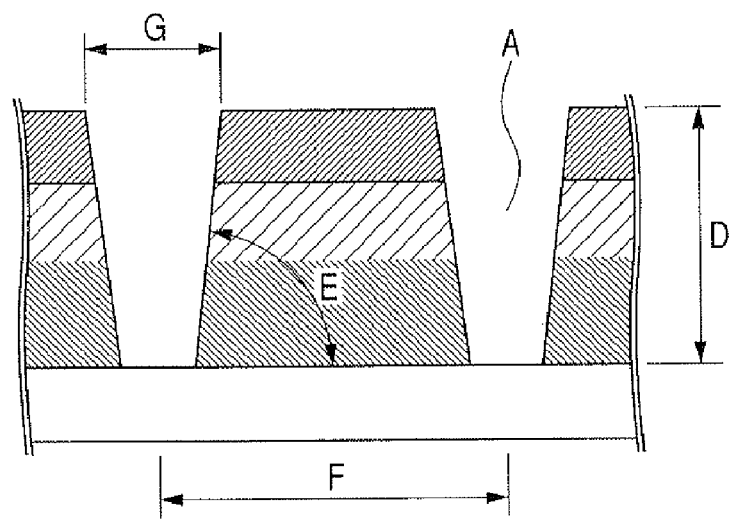

As illustrated in each of FIGS. 5A and 5B, the shape of each three-dimensional portion A may have a concave structure or a convex structure. Each three-dimensional portion A has only to have a shape with which the crack or film quality discontinuous region of the sealing layer 9 can be obtained upon division of an organic light emitting apparatus. A desirable shape will be described with reference to each of the outline sectional views of FIGS. 5A and 5B. A height or depth D of each three-dimensional portion A is desirably 0.1 µm or more, or one hundredth or more of the thickness of the sealing layer 9. When the height or depth D of each three-dimensional portion A is less than 0.1 µm, or less than one hundredth of the thickness of the sealing layer 9, the three-dimensional portion A is excessively small as compared to the sealing layer 9. As a result, a crack or film quality discontinuity to be formed at the initial stage of the formation of the sealing layer 9 is filled or uniformized in the course of the overlapping of films. Accordingly, individual organic light emitting apparatuses cannot be divided unless a large external impact is applied to the sealing layer 9, with the result that damage such as peeling or cracking occurs in association with the division.

A taper angle E of each three-dimensional portion A is not particularly limited as long as a crack or film quality discontinuity can be generated in the sealing layer 9. The maximum value for the angle is desirably 10° or more, and, furthermore, is desirably 45° or more. The maximum value may be 90° or more. In addition, all the three-dimensional portions A to be formed on the base material 1 do not need to have the same taper angle. For example, when plural three-dimensional portions A are formed on the periphery of a display region, the taper angles of adjacent three-dimensional portions A and A can be made different from each other.

A width G of each three-dimensional portion A is not particularly limited as long as the width allows the three-dimensional portion A to be certainly formed. However, the width is desirably as small as possible because a large width leads to the expansion of a frame region. The width of each three-dimensional portion A is desirably smaller than the height or depth D of the portion.

When plural three-dimensional portions A are formed, a pitch F between adjacent three-dimensional portions A and A does not need to be constant, and can take an arbitrary value; provided, however, that the pitch F larger than the height or depth D of each three-dimensional portion A is desirable because the case where the pitch F is excessively small results in the occurrence of the case where a crack penetrating through the sealing layer 9 or film quality discontinuity cannot be obtained.

With the aid of each three-dimensional portion A, the crack or film quality discontinuous region of the sealing layer 9 to be generated upon division of individual organic light emitting apparatuses allows the sealing layer 9 to be easily divided by applying a small external impact at the position where the three-dimensional portion A is formed. Alternatively, selecting the shape of each three-dimensional portion A allows the formation of the sealing layer 9 completely sectioned at the position where the three-dimensional portion A is formed without the application of an external impact.

Examples of a method of forming each three-dimensional portion A include a method involving forming a concave structure or a convex structure by etching and a method involving forming a convex structure by mask film formation. Each portion is desirably formed by etching in the case of such active matrix type light emitting apparatus as illustrated in FIG. 1A. This is because each three-dimensional portion can be formed simultaneously with a patterning step upon production of a TFT. According to the method, each three-dimensional portion can be easily formed while a production cost is suppressed.

Figure 6:
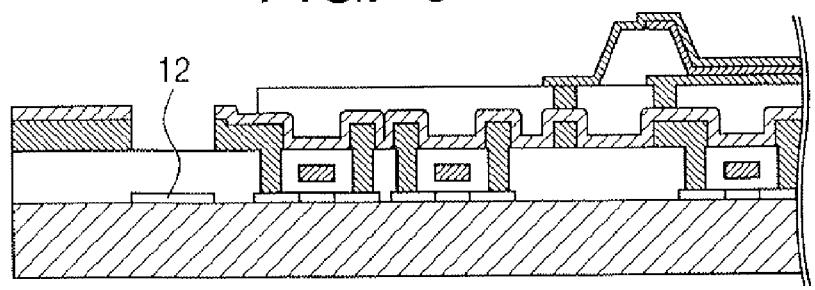
FIG. 6 is a sectional view schematically illustrating a positional relationship between the three-dimensional portion of the organic light emitting apparatus of the present invention and a resistance wire.

Further, for example, as illustrated in FIG. 6, a resistance wire 12 can be provided along each three-dimensional portion A in order that the sealing layer 9 may be certainly sectioned at the crack or film quality discontinuous region of the sealing layer 9 formed by the three-dimensional portion A. A current is flowed into the resistance wire 12 so that the three-dimensional portion A is heated. As a result, a strong stress is generated in the sealing layer 9, whereby the sealing layer 9 is sectioned at the crack or film quality discontinuous region of the sealing layer 9. The resistance wire 12 is not particularly limited as long as the three-dimensional portion A can be heated by flowing a current into the wire; the wire is desirably formed by patterning by using the layer for constituting a TFT simultaneously with the formation of the conductive layer.

The first electrode 5 is not particularly limited as long as it is made of an electrode material having high conductivity. For example, Cr, Al, or Ag as a material having a high reflectivity can be used. A transparent electrode such as ITO or IZO may be laminated and used.

The second electrode 7 is not particularly limited as long as it is made of an electrode material having high conductivity. For example, the electrode is formed of a highly transmissive or semi-transmissive material; an oxide film containing In such as ITO and IZO or Ag can be used.

The sealing layer 9 is not particularly limited as long as it has a high ability to shield moisture or a gas component. A film formed of an inorganic material generally known to have high moisture barrier property and high gas barrier property (which may hereinafter be abbreviated as "inorganic film") can be used. In addition, the sealing layer 9 may be obtained by laminating two or more kinds of films different from each other in composition. The sealing layer may be constituted by laminating an inorganic film and an organic film depending on properties requested of the sealing layer. However, it is not desirable that an organic film be formed at a position B where the organic light emitting apparatus is to be divided because the film serves as a propagation path for moisture or a gas component.

The thickness of the sealing layer 9 is not particularly limited as long as shielding performance against moisture or a gas component can be secured. The thickness is desirably 0.5 µm or more in order that sufficient sealing performance may be obtained, specifically, the smoothness of the surface of the second electrode 7 may be secured, and dirt adhering to the surface may be covered.

The inorganic film for use in the sealing layer 9 of the present invention can be formed by, for example, plasma CVD. When the excitation frequency of plasma CVD to be used is in a VHF band ranging from 30 MHz to 100 MHz, the ion impact of plasma can be weakened, and thermal damage to an organic EL device can be suppressed. At the same time, a good inorganic sealing layer can be realized, which: is dense and free of any defect; favorably covers an inclined plane or irregularities; shows high moisture resistance; and has a low stress. The inorganic film desirably has a hydrogen concentration of 12 to 32 atomic % with respect to the total number of silicon, nitrogen, hydrogen, and oxygen atoms. In such case, the inorganic film favorably adheres to an organic sealing layer as a base layer, favorably covers irregularities, is effective in alleviating a thermal stress, and has an enormous effect on a temperature increase due to light emission by an organic EL device. A hydrogen concentration of 17 to 28 atomic % is additionally effective.

An organic light emitting apparatus formed of the sealing layer 9 provided with such hydrogen concentration gradient as described above can not only show high moisture resisting performance but also suppress the reflection of light caused by the lamination of films different from each other in reflectivity to improve a light transmittance.

FIGS. 7A to 7D each illustrate an example of a method of producing an organic light emitting apparatus according to the present invention.

Figure 7A:
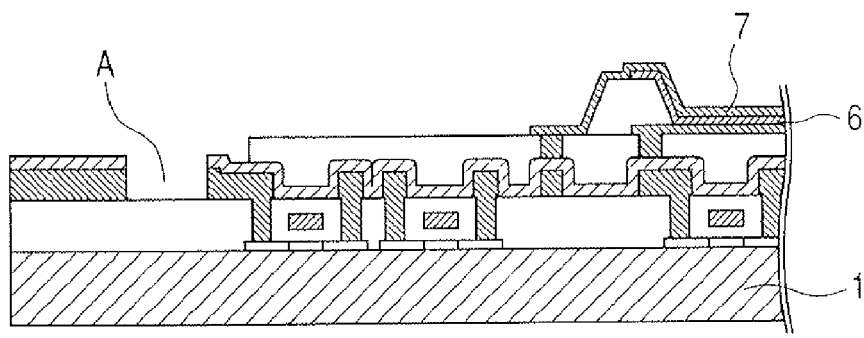
FIGS. 7A, 7B, 7C and 7D are sectional views each schematically illustrating an example of a method of producing an organic light emitting apparatus of the present invention.
Figure 7B:
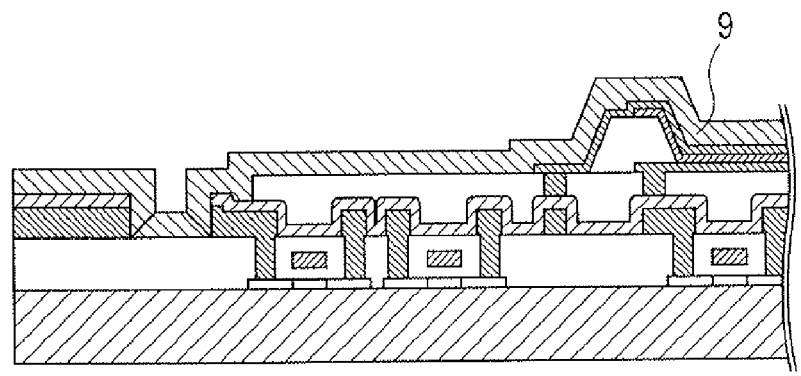
Figure 7C:
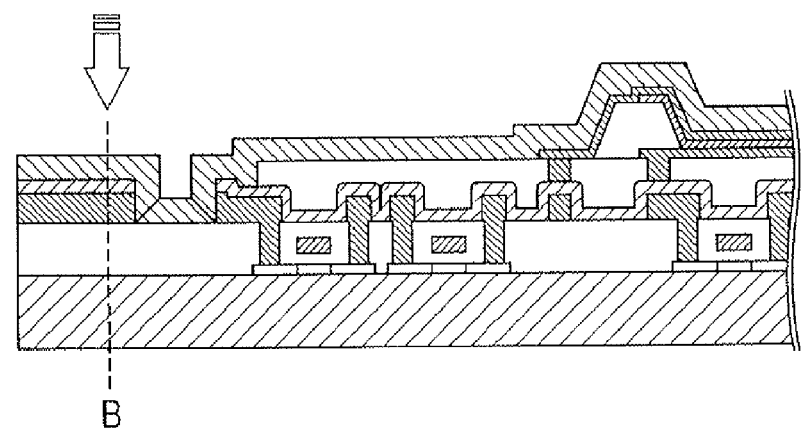
Figure 7D:
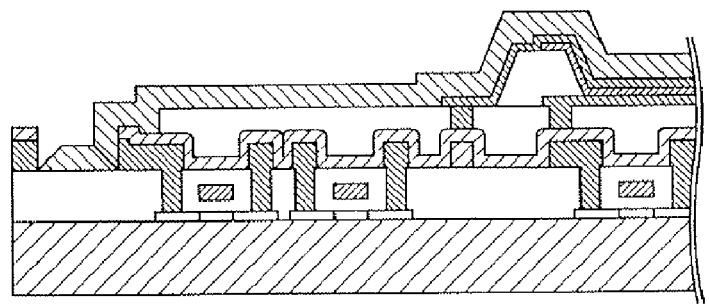

The stack layer 6 and the second electrode 7 are formed on a substrate on which a three-dimensional portion A having a concave structure is formed (FIG. 7A). Subsequently, the sealing layer 9 is formed, whereby a raw material substance is adsorbed to and deposited on the substrate so that film formation proceeds. As a result, a crack or a film quality discontinuous region is generated in a portion of the three-dimensional portion A at the position where the deposition rate of the substance is discontinuous (FIG. 7B). In the crack or film quality discontinuous region of the sealing layer 9, the sealing layer 9 can be easily divided by an external impact such as an external force, heat, or an electromagnetic wave without causing large damage such as peeling or a crack to the sealing layer 9. In addition, the division surface of the sealing layer 9 has high moisture resisting performance, and hence has such high shielding performance that moisture or a gas component is prevented from infiltrating from the position where the sealing layer 9 is divided. Next, the sealing layer 9 and the substrate are divided in the direction parallel to the three-dimensional portion A at a division position B on or outside the three-dimensional portion A (FIG. 7C). Although damage in association with the division is generated in the sealing layer 9, the peeling and cracking of the sealing layer 9 are held back by the crack or film quality discontinuous region of the sealing layer 9 at the position where the three-dimensional portion A is formed. As a result, damage due to the division can be prevented from propagating through the sealing layer 9 on a display region side with respect to the three-dimensional portion A (FIG. 7D).

Figure 8A:
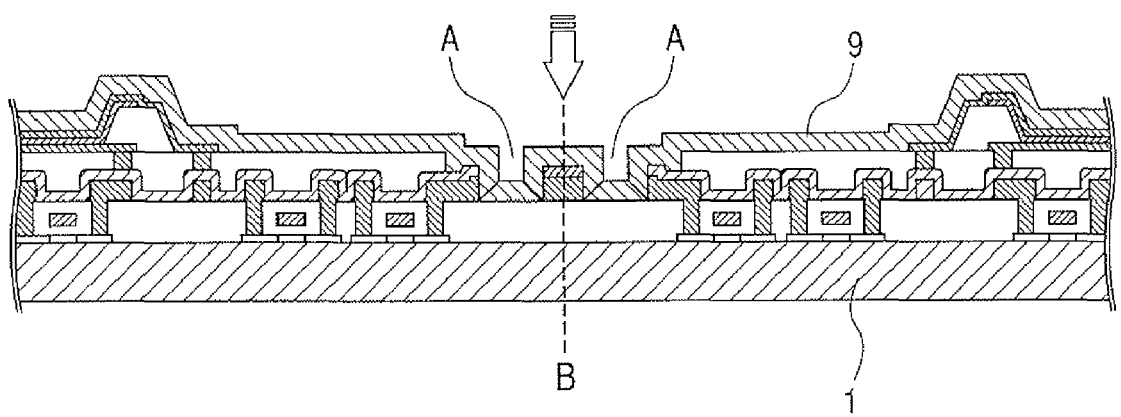
FIGS. 8A and 8B are sectional views each schematically illustrating an example of the shape, placement position, and division position of each of adjacent three-dimensional portions of the organic light emitting apparatus of the present invention.
Figure 8B:
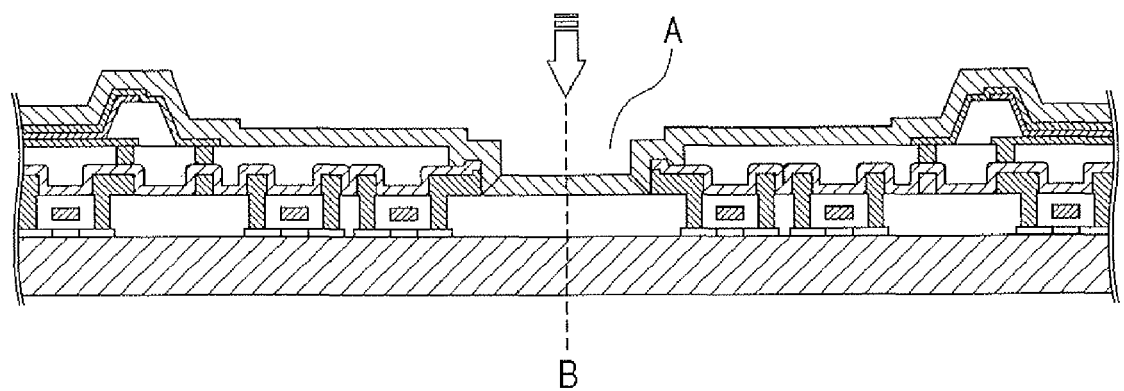

It should be noted that, in the production of an organic light emitting apparatus, from the viewpoint of a reduction in production cost, plural organic light emitting apparatuses are formed on one substrate so that the plural organic light emitting apparatuses are simultaneously formed, and then each organic light emitting apparatus is divided. FIGS. 8A and 8B each illustrate an example of the position where each three-dimensional portion A is formed upon placement of plural organic light emitting apparatuses on a substrate.

FIG. 8A illustrates an example in which three-dimensional portions A each having a concave structure are formed on both sides of the division position B. In this case, the substrate is divided at the division position B in the direction parallel to each three-dimensional portion A. Although a crack and peeling are generated in the sealing layer 9 at the division position B, the peeling and cracking of the sealing layer 9 are held back by the crack or film quality discontinuous region of the sealing layer 9 at the position where each three-dimensional portion A is formed. As a result, damage due to the division does not propagate through the sealing layer 9 on a display region side. In FIG. 8B, a three-dimensional portion A having a concave structure is formed so as to straddle the division position B. Similarly, the peeling and cracking of the sealing layer 9 generated at the division position B are held back at the position where the three-dimensional portion A is formed. As a result, damage due to the division does not propagate through the sealing layer 9 on a display region side.

As described above, plural three-dimensional portions A can be formed between adjacent organic light emitting apparatuses. In this case, the sealing layer 9 may be divided at an arbitrary position as long as it is divided at a position outside the three-dimensional portion A closest to a display region. In other words, at least one three-dimensional portion A must be formed between the position where the sealing layer 9 is divided and the display region.

Each of those three-dimensional portions A may be formed by an arbitrary method by using an arbitrary material as long as a desired structure can be realized. However, the addition of a material and a process only for forming each three-dimensional portion A leads to: an increase in cost of an organic light emitting apparatus; and a reduction in production yield. In view of the foregoing, each three-dimensional portion is desirably formed by using an existing constituent layer by an existing process.

For example, when a three-dimensional portion A having a concave structure is produced, the portion can be formed in a TFT and the insulating layer 3 to be formed on a substrate. More specifically, etching is performed at the position where the three-dimensional portion A is to be formed simultaneously with the provision of the insulating layer 3 with a contact hole, whereby the three-dimensional portion A having the depth D corresponding to the thickness of the insulating layer 3 can be formed. When the depth D must be equal to or larger than the thickness of the insulating layer 3, a three-dimensional portion A having the depth D whose maximum value corresponds to the total thickness of the TFT and the insulating layer 3 can be formed by patterning a layer for constituting the TFT in correspondence with the position where the three-dimensional portion A is to be formed at the time of the formation of the TFT.

A three-dimensional portion A having a convex structure can be formed by using the leveling layer 4 and the device isolation film 8 simultaneously with the formation of each layer.

It should be noted that a substrate can be divided by employing a general scribing approach such as scribing with a cutting edge or laser scribing. Then, the substrate is broken along a scribed division line, whereby the substrate can be divided. The application of such division method to an organic light emitting apparatus free of the three-dimensional portion of the present invention involves a problem in that damage to the sealing layer 9 such as the generation of a crack in the layer or the peeling of the layer occurs at a division position.

Hereinafter, the embodiment of the present invention will be described in more detail by way of examples.

Example 1

Figure 9A:
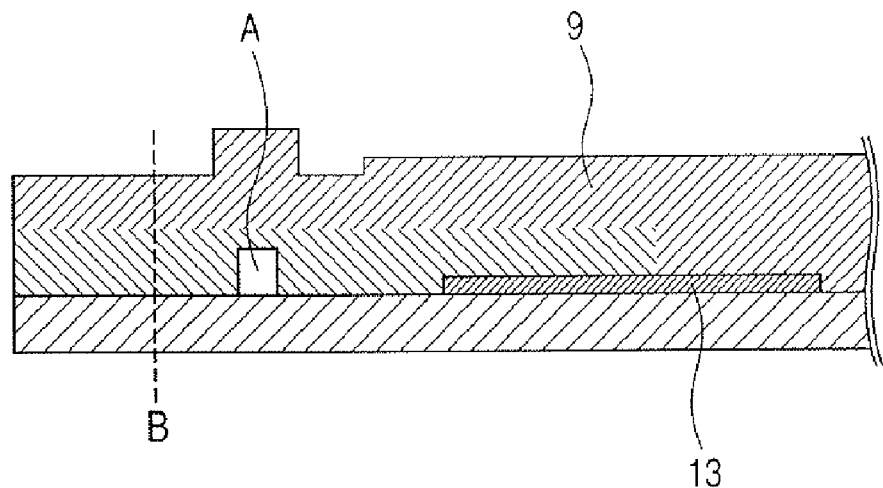
FIGS. 9A and 9B are sectional views each schematically illustrating the outline of the constitution of an evaluation substrate in Example 1.

This example will be described with reference to FIGS. 9A and 9B. FIG. 9A is a sectional view schematically illustrating a part taken out of an evaluation sample, and FIG. 9B is a top view schematically illustrating the part.

Figure 9B:
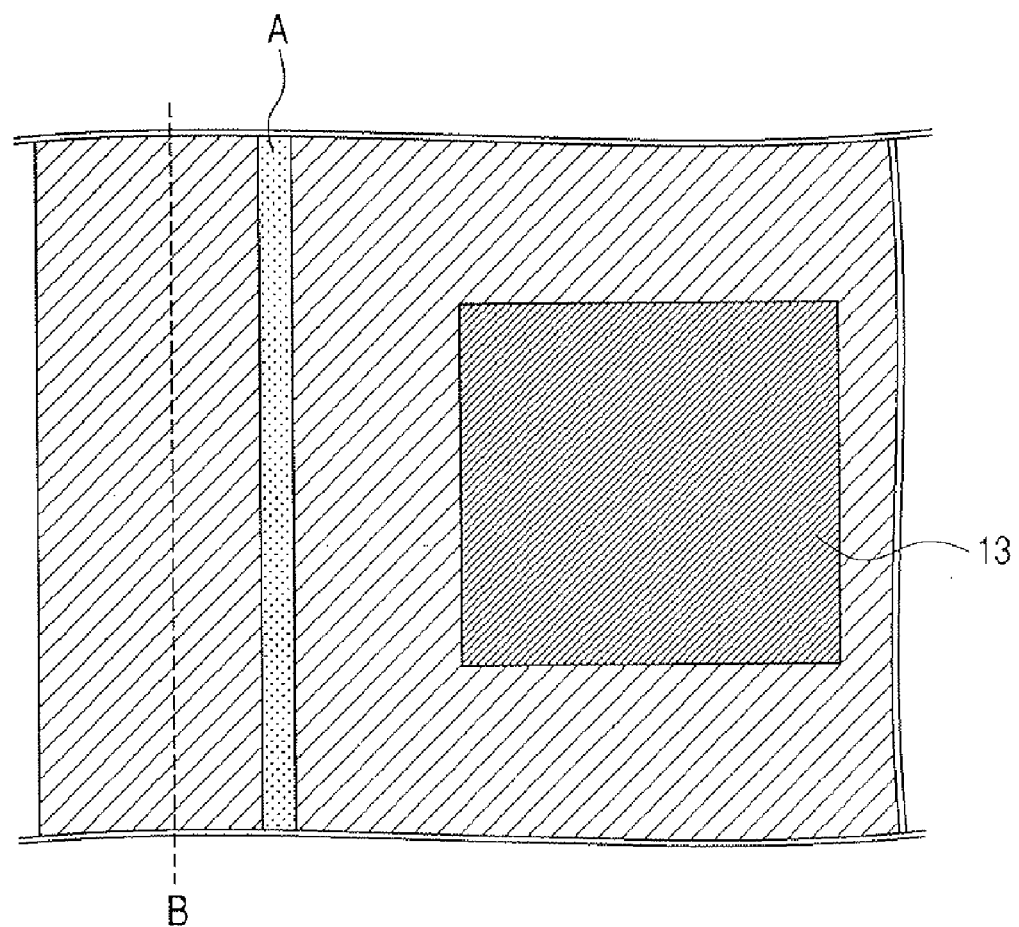

In this example, the evaluation sample was produced as illustrated in each of FIGS. 9A and 9B, and was evaluated for the presence or absence of the infiltration of moisture from a division position on the basis of change in transmittance due to Ca corrosion. The transmittance of a Ca film changes as a result of a reaction between the Ca film and water or oxygen.

A three-dimensional portion A having a height of 0.5 µm, a width of 1 µm, and a taper angle of 55° was formed in a line shape on a substrate obtained by forming an insulating layer on a glass base material. Next, a Ca film 13 having a thickness of 1,000 Å was formed by vapor deposition partially at the central portion of the substrate at the position distant from the three-dimensional portion A by 0.2 mm. Subsequently, a silicon nitride film having a thickness of 5 µm was formed by VHF plasma CVD so as to cover the three-dimensional portion A and the Ca film 13, whereby the sealing layer 9 was formed. A process commencing on the loading of the substrate and ending on the formation of the sealing layer 9 was performed in a vacuum.

Next, the substrate was scribed from the side of the sealing layer 9 with a highly permeable hole cutting blade at the position distant from an end of the Ca film by 0.3 mm and from the three-dimensional portion A by 0.1 mm, whereby the evaluation sample was produced.

The division position of the sample of this example was observed with an SEM. As a result, the occurrence of the peeling and cracking of the sealing layer 9 was observed at the division position B. However, the peeling and cracking of the sealing layer 9 were held back at the position of the three-dimensional portion A, so none of peeling and a crack was observed in the sealing layer 9 on the side of the Ca film.

The evaluation sample of this example was left in a thermo-hygrostat having a temperature of 60° C. and a relative humidity of 90% RH. After a lapse of 1,000 hours from the leaving, the transmittance of the Ca film was measured, but showed no change.

Comparative Example 1

Figure 10:
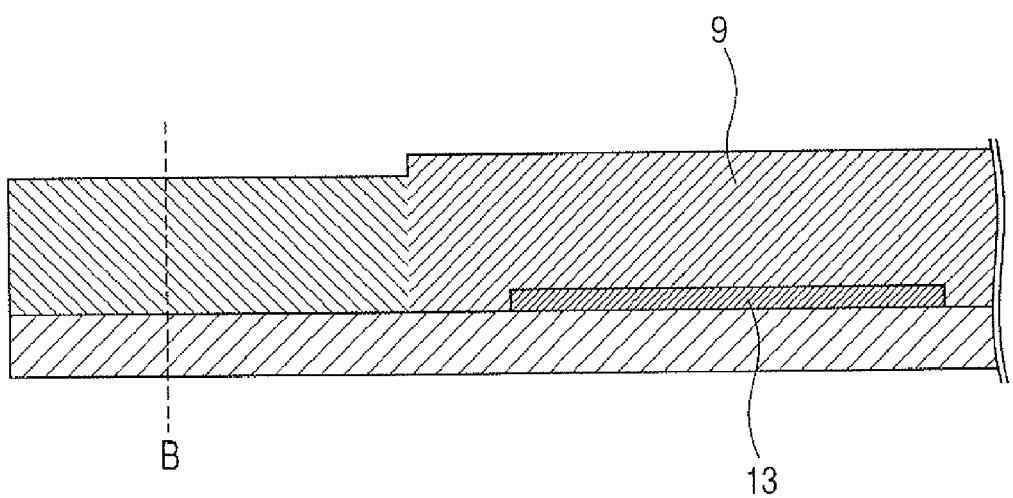
FIG. 10 is a sectional view schematically illustrating the outline of the constitution of an evaluation substrate in a comparative example.

This comparative example will be described with reference to FIG. 10. FIG. 10 is a sectional view schematically illustrating a portion taken out of an evaluation sample.

In this comparative example, the evaluation sample was produced as illustrated in FIG. 10, and was evaluated for the presence or absence of the infiltration of moisture from a division position on the basis of a change in transmittance due to Ca corrosion.

The evaluation sample of this comparative example was produced by the same process as that of Example 1 except that the three-dimensional portion A was not formed. The substrate 1 was divided from the side of the sealing layer 9 at the position distant from an end of the Ca film by 0.3 mm.

The division position of the sample of this comparative example was observed with an SEM. As a result, the occurrence of the peeling and cracking of the sealing layer 9 was observed. Damage to the sealing layer 9 due to the division occurred in the range of 0.5 mm or less from the division position.

The evaluation sample of this comparative example was left in a thermo-hygrostat having a temperature of 60° C. and a relative humidity of 90% RH. After a lapse of 1,000 hours from the leaving, the Ca film was corroded in a direction originating from the division position, and a reduction in transmittance was observed over a region of about 25 mm.

Comparative Example 2

In this comparative example, an evaluation sample was produced as illustrated in FIG. 10, and was evaluated for the presence or absence of the infiltration of moisture from a division position on the basis of a change in transmittance due to Ca corrosion.

The evaluation sample of this comparative example was produced by the same process as that of Example 1 except that the three-dimensional portion A was not formed. The substrate 1 was divided from the side of the substrate 1 at the position distant from an end of the Ca film by 0.3 mm.

The division position of the sample of this comparative example was observed with an SEM. As a result, the occurrence of the peeling of the sealing layer 9 was observed. Damage to the sealing layer 9 due to the division occurred in the range of 0.3 mm or less from the division position.

The evaluation sample of this comparative example was left in a thermo-hygrostat having a temperature of 60° C. and a relative humidity of 90% RH. After a lapse of 1,000 hours from the leaving, the Ca film was corroded in a direction originating from the division position, and a reduction in transmittance was observed over a region of about 15 mm.

Example 2

This example will be described with reference to FIGS. 1A, 2 and 8A.

In this example, an organic light emitting apparatus illustrated in FIG. 1A was produced, and was evaluated for light emitting property.

In this example, organic light emitting apparatuses each having the constitution illustrated in FIG. 1A were formed on a large substrate so as to be adjacent to each other. Each organic light emitting apparatus was divided after the formation of the sealing layer 9. As illustrated in FIG. 2, the three-dimensional portions A were formed between adjacent organic light emitting apparatuses on two sides except the side on which a power source and the signal supply pad 14 were formed and a side opposed to the side.

As illustrated in FIG. 8A, three three-dimensional portions A each having a concave structure with a depth of 0.5 µm, a width of 5 µm, and a taper angle of 60° were formed from a position distant from the division position B by 0.1 mm toward a display region side at a pitch of 10 µm so as to be symmetric with respect to the division position B.

The organic light emitting apparatus of this example was produced as described below. The layer 2 for constituting a TFT, the insulating layer 3, and the organic leveling layer 4 were sequentially formed on the glass base material 1, whereby a substrate was produced. Next, a contact hole between the first electrode 5 to be formed on the substrate and the layer 2 for constituting a TFT was formed. The above-mentioned three-dimensional portions A were formed in the insulating layer 3 simultaneously with the formation of the contact hole. Subsequently, the first electrode 5 was formed, and the device isolation film 8 made of polyimide was formed on the periphery of the first electrode 5 to insulate the electrode. The stack layer 6 made of FL03/DpyFL+sDTAB2/DFPH1/DFPH1+$Cs_2CO_3$ was deposited from the vapor onto the substrate, whereby the stack layer 6 obtained by laminating a hole transporting layer, a light emitting layer, an electron transporting layer, and an electron injecting layer in the stated order was formed. The second electrode 7 made of ITO and having a thickness of 60 nm was formed by sputtering on the laminate, whereby a pixel was formed. Further, a silicon nitride film having a thickness of 5 μm was formed by VHF plasma CVD so as to cover the organic leveling layer 4, the first electrode 5, the stack layer 6, the second electrode 7, the device isolation film 8, the adhesive 10, and the three-dimensional portions A, whereby the sealing layer 9 was formed. A process commencing on the loading of the glass base material 1 and ending on the formation of the sealing layer 9 was performed in a vacuum.

Next, the substrate was scribed from the side of the sealing layer 9 with a highly permeable hole cutting blade at the division position B, whereby each organic light emitting apparatus was divided. Subsequently, the circular polarizer 11 was bonded to the sealing layer 9 of each organic light emitting apparatus by using the adhesive 10, whereby the organic light emitting apparatus illustrated in FIG. 1A was produced.

The division position of the organic light emitting apparatus of this example was observed with an optical microscope and an SEM. As a result, a crack and peeling were observed in the sealing layer 9. However, none of a crack and peeling was observed in the sealing layer 9 on the display region side with respect to the three-dimensional portion A closest to the display region.

The organic light emitting apparatus of this example was left in a thermo-hygrostat having a temperature of 60° C. and a relative humidity of 90% RH. After a lapse of 1,000 hours from the leaving, the apparatus was evaluated for V-I characteristics and luminance, but the deterioration of the V-I characteristics and of the luminance was not observed. In addition, none of a luminance change and a dark spot having a diameter Φ of 1 μm or more occurred from the outer peripheral region of the organic light emitting apparatus. In addition, none of luminance deterioration and a dark spot having a diameter Φ of 1 μm or more occurred from the periphery of the pixel.

Example 3

This example will be described with reference to FIGS. 1A, 2 and 8B.

In this example, an organic light emitting apparatus similar to that of Example 2 was produced, and was evaluated for light emitting property; provided that, in this example, as illustrated in FIG. 8B, a concave structure having a depth of 0.5 μm, a width of 100 μm, and a taper angle of 60° was formed as a three-dimensional portion A so as to straddle the division position B, and, furthermore, three three-dimensional portions A each having a depth of 0.5 μm, a width of 5 μm, and a taper angle of 60° were formed from an end of the concave structure toward a display region side at a variable pitch of 30 μm, 20 μm, and 10 μm.

The division position of the organic light emitting apparatus of this example was observed with an optical microscope and an SEM. As a result, a crack and peeling were observed in the sealing layer 9. However, none of a crack and peeling was observed in the sealing layer 9 on the display region side with respect to the three-dimensional portion A closest to the display region.

The organic light emitting apparatus of this example was left in a thermo-hygrostat having a temperature of 60° C. and a relative humidity of 90% RH. After a lapse of 1,000 hours from the leaving, the apparatus was evaluated for V-I characteristics and luminance, but the deterioration of the V-I characteristics and of the luminance was not observed. In addition, none of a luminance change and a dark spot having a diameter Φ of 1 μm or more occurred from the outer peripheral region of the organic light emitting apparatus. In addition, none of luminance deterioration and a dark spot having a diameter Φ of 1 μm or more occurred from the periphery of the pixel.

The organic light emitting apparatus according to the present invention is excellent in ability to shield moisture and a gas component. Therefore, the apparatus can be utilized in, for example, the display apparatus of a mobile instrument such as the monitor of a digital camera or of a digital video camera which: is assumed to be used in a wide range of temperatures or of humidity; and requires high environmental resistance.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2006-087310, filed Mar. 28, 2006, and 2007-026707, filed Feb. 6, 2007, which are hereby incorporated by reference herein in their entirety.

What is claimed is:

1. A method of producing an organic light emitting apparatus, the organic light emitting apparatus having a substrate, an organic light emitting device having a first electrode, an organic light emitting layer, and a second electrode formed in the stated order on the substrate, and an inorganic sealing layer formed to cover an upper portion of the organic light emitting device and a surface of the substrate and to extend toward an end of the substrate, the method comprising the steps of:

forming the organic light emitting device having the first electrode, the organic light emitting layer, and the second electrode in the stated order on the substrate;

forming a three-dimensional portion along a division line set in advance on the surface of the substrate;

forming the inorganic sealing layer by plasma CVD in the division line from above the second electrode so that the inorganic sealing layer straddles the three-dimensional portion; and dividing the substrate and inorganic sealing layer along the division line at a three-dimensional portion or outside the three-dimensional portion.

2. The method of producing an organic light emitting apparatus according to claim 1, wherein the dividing step has a step of scribing the inorganic sealing layer along the division line and a step of breaking the substrate and inorganic sealing layer along the scribed division line.

3. The method of producing an organic light emitting apparatus according to claim 1, wherein:

the step of forming the organic light emitting device comprises a step of forming plural organic light emitting devices on the substrate; and the division line is present between adjacent devices of the organic light emitting devices.

4. The method of producing an organic light emitting apparatus according to claim 1, wherein the step of forming the three-dimensional portion comprises an etching step.

5. A method of producing an organic light emitting apparatus, the organic light emitting apparatus having a substrate, a display region including plural organic light emitting devices, and an inorganic sealing layer formed to cover an upper portion of the display region and a surface of the substrate and to extend toward an end of the substrate, the method comprising the steps of:

forming plural display regions by forming plural organic light emitting devices;

forming plural three-dimensional portions between the adjacent display regions on the surface of the substrate with a predetermined pitch between the portion and the display regions;

forming the inorganic sealing layer by plasma CVD over the display regions so that the inorganic sealing layer straddles the three-dimensional portion portions; and dividing the substrate and inorganic sealing layer at the three-dimensional portion or outside the three-dimensional portions.

6. The method of producing an organic light emitting apparatus according to claim 5, wherein:

in the step of forming plural three-dimensional portions, the plural three-dimensional portions are formed between the display regions; and in the step of dividing the substrate and inorganic sealing layer, the substrate and the inorganic sealing layer are divided between the plural three-dimensional portions.

7. The method of producing an organic light emitting apparatus according to claim 5, wherein:

the step of forming plural three-dimensional portions is conducted before the step of forming plural display regions.

8. The method of producing an organic light emitting apparatus according to claim 5, wherein:

in the step of forming three-dimensional portions, a height or depth D of each three-dimensional portion is made 0.1 µm or more, or one hundredth or more of the thickness of the sealing layer.

* * * * *